(12) United States Patent
Yang et al.

(10) Patent No.: US 8,017,259 B2
(45) Date of Patent: Sep. 13, 2011

(54) BMS HAVING WATERPROOF FUNCTION

(75) Inventors: Jae Hun Yang, Daejeon (KR); Jong-yul Ro, Daejeon (KR); Junill Yoon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 258 days.

(21) Appl. No.: 12/300,772

(22) PCT Filed: May 4, 2007

(86) PCT No.: PCT/KR2007/002191
§ 371 (c)(1),
(2), (4) Date: Jun. 17, 2009

(87) PCT Pub. No.: WO2007/132993
PCT Pub. Date: Nov. 22, 2007

(65) Prior Publication Data
US 2009/0253027 A1 Oct. 8, 2009

(30) Foreign Application Priority Data

May 15, 2006 (KR) .......................... 10-2006-0043199

(51) Int. Cl.
*H01M 10/02* (2006.01)
(52) U.S. Cl. .................. 429/61; 429/92; 429/96; 429/7; 429/181; 429/163
(58) Field of Classification Search .................. 429/61, 429/92
See application file for complete search history.

(56) References Cited

U.S. PATENT DOCUMENTS

| 6,379,837 | B1 * | 4/2002 | Takahashi et al. | 429/151 |
| 6,492,058 | B1 * | 12/2002 | Watanabe et al. | 429/121 |

FOREIGN PATENT DOCUMENTS

| JP | 7-326422 | A | | 12/1995 |
| JP | 2001-007547 | | * | 1/2001 |
| JP | 2001-7547 | A | | 1/2001 |
| JP | 16-056164 | A | | 2/2004 |

* cited by examiner

*Primary Examiner* — Melvin C Mayes
*Assistant Examiner* — Colette Nguyen
(74) *Attorney, Agent, or Firm* — Birch, Stewart, Kolasch & Birch, LLP

(57) ABSTRACT

Disclosed herein is a battery management system for controlling the operation of a middle- or large-sized battery pack, the battery management system comprising: a battery management system printed circuit board (BMS PCB) comprising a circuit and elements for controlling the operation of the battery pack; a connector attached to one side of the BMS PCB; a housing including a housing body for receiving the BMS PCB while partially exposing the connector and a cover for covering the housing body, the cover is coupled to the housing body while the cover is disposed on the housing body; and a waterproofing member interposed between the housing body and the cover, constituting the housing, such that the waterproofing member is in tight contact with the interface between the housing body and the cover, the waterproofing member being constructed in a structure to be coupled at coupling regions of the housing body and the cover. The battery management system according to the present invention is constructed in a structure in which moisture is prevented from permeation into the housing of the battery management system in a high-temperature, high-humidity environment. Consequently, the present invention has the effect of preventing the damage to and the corrosion of the BMS PCB, and therefore, improving the reliability of the battery pack and increasing the service life of the battery pack.

6 Claims, 2 Drawing Sheets

BMS HAVING WATERPROOF FUNCTION

FIELD OF THE INVENTION

The present invention relates to a waterproof battery management system (BMS), and, more particularly, to a battery management system for controlling the operation of a middle- or large-sized battery pack, the battery management system comprising: a battery management system printed circuit board (BMS PCB) comprising a circuit and elements for controlling the operation of the battery pack; a connector attached to one side of the BMS PCB; a housing including a housing body for receiving the BMS PCB while partially exposing the connector and a cover for covering the housing body, the cover is coupled to the housing body while the cover is disposed on the housing body; and a waterproofing member interposed between the housing body and the cover, constituting the housing, such that the waterproofing member is in tight contact with the interface between the housing body and the cover, the waterproofing member being constructed in a structure to be coupled at coupling regions of the housing body and the cover.

BACKGROUND OF THE INVENTION

Recently, a secondary battery, which can be charged and discharged, has been widely used as an energy source for wireless mobile devices. Also, the secondary battery has attracted considerable attention as an energy source for electric vehicles and hybrid electric vehicles, which have been developed to solve problems, such as air pollution, caused by existing gasoline and diesel vehicles using fossil fuel. As a result, the kinds of applications using the secondary battery are being increased owing to the advantages of the secondary battery, and hereafter the secondary battery is expected to be applied to more applications and products than now.

As the kinds of applications and products, to which the secondary battery is applicable, are increased, the kinds of batteries are also increased such that the batteries can provide outputs and capacities suitable for the applications and products. For example, small-sized mobile devices, such as mobile phones, personal digital assistants (PDAs), digital cameras, and laptop computers, use one or several small-sized, light-weight battery cells (unit cells) for each device according to the reduction in size and weight of the corresponding products. On the other hand, middle- or large-sized devices, such as electric bicycles, electric vehicles, and hybrid electric vehicles, use a battery pack having a plurality of unit cells electrically connected with each other because high output and large capacity is necessary for the middle- or large-sized devices.

The middle- or large-sized battery pack includes a plurality of unit cells, which are mounted in a housing (case) having a predetermined size while being electrically connected with each other, and a battery management system (BMS) circuit unit mounted at the inner surface and the outer surface of the case for detecting the voltage, current, and temperature of the unit cells, and therefore, controlling the operation of the battery pack.

In the case that the battery pack is used for electric bicycles, electric vehicles, or hybrid electric vehicles, on the other hand, it is required for the battery pack to have a durability such that in various environments, for example, in a high-humidity condition such as the rainy season and when the battery pack is used for a long period of time.

Especially, the circuit of the BMS is congested, and therefore, the loading density of the element is very high, due to the structure of the compact battery pack. Consequently, when foreign matter, especially moisture, is introduced into the BMS, the circuit and elements of the BMS may be easily corroded due to the moisture. As a result, short circuits of the circuit and elements of the BMS may easily occur, the battery pack may malfunction, and the service life of the battery pack may be greatly reduced. There have been proposed various battery management systems each having a waterproofing member for preventing the malfunction of the battery pack due to the permeation of the moisture. For example, Japanese Patent Application Publication No. 2004-056164 and No. 2001-007547 disclose an O-ring, as a waterproofing member, interposed between a housing body and a cover, constituting a housing, for preventing the permeation of moisture into the battery pack.

However, the technologies for simply interposing the O-ring are limited to be preferably applied to a middle- or large-sized battery pack having a strong possibility of the middle- or large-sized battery pack being exposed to severe conditions. Specifically, O-ring has a strong possibility of the O-ring to be separated from the middle- or large-sized battery pack due to vibration and impact. When the O-ring is separated from the battery pack, much more moisture may permeate into the battery pack through the gap formed due to the separation of the O-ring. Furthermore, micro conductive particles may also be introduced into the battery pack.

Consequently, there is a high necessity for a battery management system that fundamentally solves the above-mentioned problems and is preferably applied to middle- or large-sized battery packs.

SUMMARY OF THE INVENTION

Therefore, the present invention has been made to solve the above problems, and other technical problems that have yet to be resolved.

As a result of a variety of extensive and intensive studies and experiments to solve the problems as described above, the inventors of the present invention have found that, when a waterproofing member is interposed between a housing body and a cover, constituting a housing in which a battery management system printed circuit board (BMS PCB) comprising a circuit and elements for controlling the operation of a battery pack is mounted, such that the waterproofing member is in tight contact with the interface between the housing body and the cover, and therefore, the waterproofing member is coupled at coupling regions of the housing body and the cover, moisture is prevented from permeation into the housing of the battery management system in a high-temperature, high-humidity environment, thereby preventing the damage to and the corrosion of the BMS PCB, improving the reliability of the battery pack, and increasing the service life of the battery pack. The present invention has been completed based on these findings.

In accordance with one aspect of the present invention, the above and other objects can be accomplished by the provision of a battery management system for controlling the operation of a middle- or large-sized battery pack, the battery management system comprising: a battery management system printed circuit board (BMS PCB) comprising a circuit and elements for controlling the operation of the battery pack; a connector attached to one side of the BMS PCB; a housing including a housing body for receiving the BMS PCB while partially exposing the connector and a cover for covering the housing body, the cover is coupled to the housing body while the cover is disposed on the housing body; and a waterproofing member interposed between the housing body and the cover, constituting the housing, such that the waterproofing member is in tight contact with the interface between the housing body and the cover, the waterproofing member being constructed in a structure to be coupled at coupling regions of the housing body and the cover.

Consequently, when the housing body and the cover is coupled to each other to construct the battery management system according to the present invention, the waterproofing member is brought completely into tight contact with the interface between the housing body and the cover, whereby the BMS PCB mounted in the housing, constituted by the housing body and the cover, is protected from foreign matter, such as moisture. In addition, the fixed state of the waterproofing member is stably maintained, even when external vibration and impact are applied to the battery management system, and therefore, the safety of the battery pack is further improved.

When the battery management system is sealed using the waterproofing member, on the other hand, heat, generated during the operation of the battery management system, may accumulate in the battery management system. In battery management systems, which are currently used or may be improved based on the currently-used battery management systems, however, the increase in temperature due to power supply parts having the highest operating temperature is merely 8° C. at the most based on the room temperature. Consequently, the accumulation of the generated heat is negligible.

According to the present invention, the waterproofing member is not particularly restricted so long as the waterproofing member is constructed in a structure to be applied to the interface between the housing body and the cover. The waterproofing member is deformable depending upon the shape of the interface. Preferably, the waterproofing member is an O-ring. The O-ring may have a coupling structure corresponding to the coupling regions of the housing body and the cover.

In a preferred embodiment, the housing body is provided inside sidewalls thereof with coupling grooves, each having a thread part formed therein, and the cover is provided with through-holes corresponding to the coupling grooves of the housing body, such that screws can be threadedly inserted into the coupling grooves through the through-holes, whereby the cover is coupled to the housing body. In this case, the coupling grooves may be formed at the interface between the sidewalls of the housing body and the cover. Alternatively, the coupling grooves may be formed at the interface between the extensions of the housing body, protruding inward from the sidewalls of the housing body, and the cover.

In the above-described structure, the O-ring is provided with coupling holes corresponding to the through-holes of the cover, whereby, the waterproofing member is fixed between the housing body and the cover through the coupling using the screws. Specifically, the screws are threadedly inserted into the coupling grooves of the housing body through the through-holes of the cover and the coupling holes of the O-ring. The shape of the coupling holes of the O-ring may be changed depending upon the coupling grooves of the housing body. For example, when the coupling grooves are formed at the interface between the sidewalls of the housing body and the cover, as described above, the coupling holes may be formed through the O-ring. On the other hand, when the coupling grooves are formed at the interface between the extensions of the housing body, protruding inward from the sidewalls of the housing body, and the cover, the coupling holes may be attached to the O-ring.

According to the present invention, the waterproofing member is not particularly restricted so long as the waterproofing member is made of a material having high durability and elasticity. For example, the waterproofing member may be made of rubber.

In a preferred embodiment, the battery management system further comprises another waterproofing member interposed at the interface between the connector and the housing. Specifically, the waterproofing member may be disposed such that the waterproofing member is in tight contact with the outer surface of the connector, when the connector is constructed in a structure in which the outer surface of the connector is in contact with both the housing body and the cover at one side of the BMS PCB, although the shape of the waterproofing member is changed depending upon the installation position of the connector.

Also, the same coupling region as the interface between the housing body and the cover may be applied to the interface between the connector and the housing. In this case, the waterproofing member, mounted at the interface between the connector and the housing, may be provided with coupling holes having the same structure as the waterproofing member mounted at the interface between the housing body and the cover. When the BMS PCB and the connector are coupled to each other, however, the waterproofing member, mounted at the interface between the connector and the housing, is coupled to the BMS PCB and the connector using screws different from those used to accomplish the coupling between the housing body and the cover.

In the present invention, the interface means the contact surfaces of the corresponding members. However, the interface may be interpreted to be surfaces of the corresponding members that will be brought into contact with each other so as to accomplish the coupling between the corresponding members, during the assembly process of the corresponding members, although the corresponding members are not actually in contact with each other.

In accordance with another aspect of the present invention, there is provided a middle- or large-sized battery pack including the battery management system.

The middle- or large-sized battery pack according to the present invention is preferably used in a medium- or large-sized battery system having high output and large capacity. The range of the high output and the large capacity is not particularly restricted.

For example, the battery pack according to the present invention may be used as a power source for various applications and products, including a power source for vehicles, such as electric bicycles (e-bikes), electric motorcycles, electric vehicles, or hybrid electric vehicles, to which a great external force, such as vibration or impact, is applied. Especially, the battery pack according to the present invention is preferably used as a power source for the electric vehicles or hybrid electric vehicles, since the battery module is constructed in a compact structure and exhibits high safety.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS

Now, preferred embodiments of the present invention will be described in detail with reference to the accompanying drawings. It should be noted, however, that the scope of the present invention is not limited by the illustrated embodiments.

Figure 1:
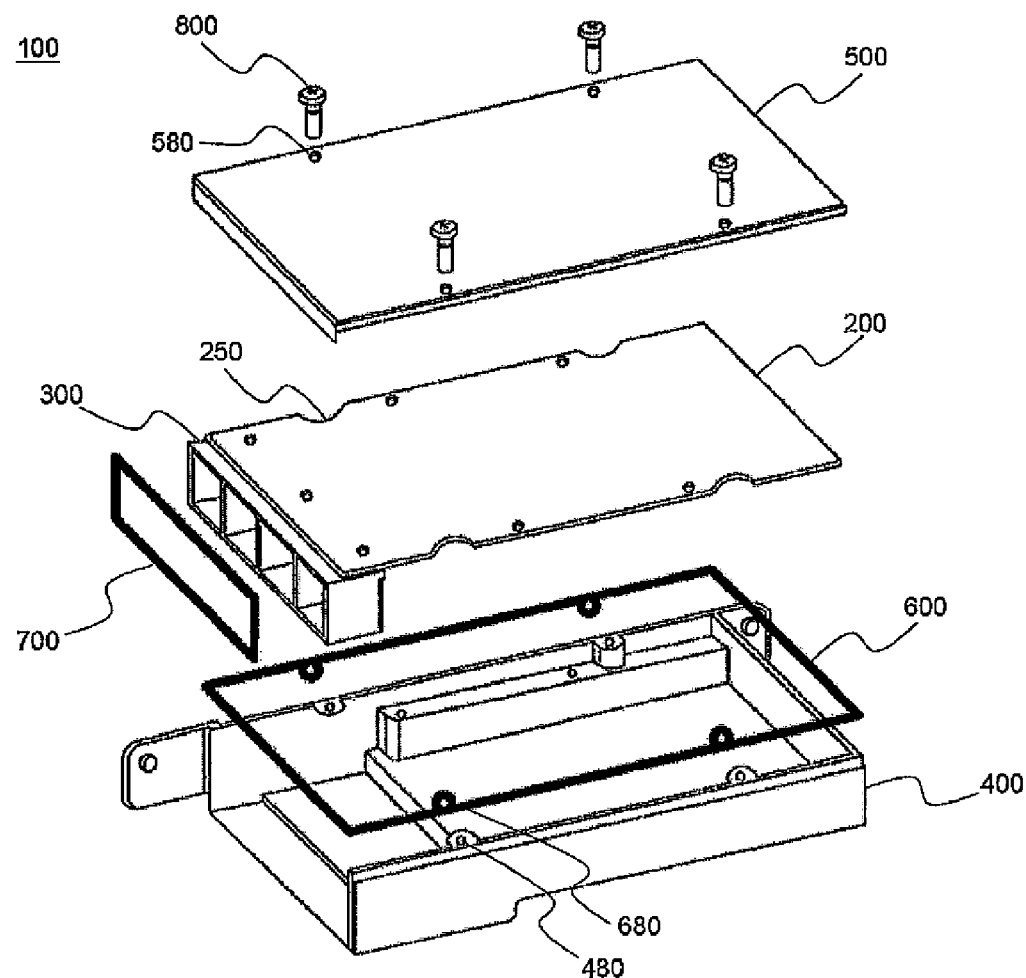
FIG. 1 is an exploded perspective view illustrating a battery management system according to a preferred embodiment of the present invention.
Figure 2:
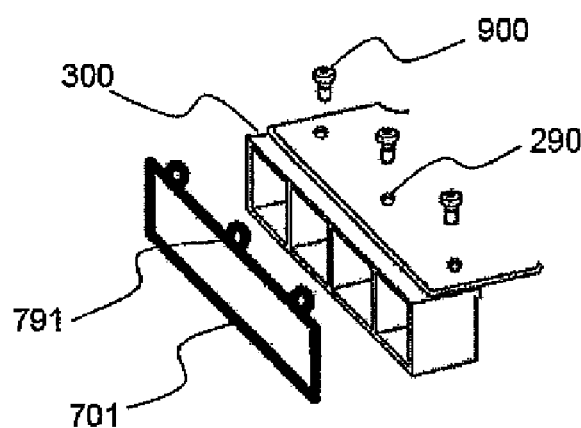
FIG. 2 is a partially enlarged view illustrating a battery management system according to a modification of FIG. 1.

FIG. 1 is an exploded perspective view typically illustrating a battery pack including a battery management system according to a preferred embodiment of the present invention, and FIG. 2 is a partially enlarged view typically illustrating a battery management system according to a modification of FIG. 1.

Referring first to FIG. 1, the battery management system 100 comprises a battery management system printed circuit board (BMS PCB) 200 for controlling the operation of a battery pack (not shown), a connector 300 attached to one side of the BMS PCB 200, and a housing 400 and 500 including a housing body 400 for receiving the BMS PCB 200 while partially exposing the connector 300 and a cover 500 for covering the housing body 400. In addition, the battery management system 100 includes two O-rings, i.e., a first O-ring 600 and a second O-ring 700, tightly interposed between the housing body 400 and the cover 500 and between the connector 300 and the housing 400 and 500 for preventing permeation of moisture into the battery management system 100.

Inside opposite sidewalls 410 and 420 of the housing body 400 are formed coupling grooves 480, each having a thread part formed therein, which protrude inward. In the cover 500 are formed through-holes 580 corresponding to the coupling grooves 480. In the first O-ring 600 are formed coupling holes 680 corresponding to the through-holes 580 of the cover 500. Consequently, screws 800 are threadedly inserted into the coupling grooves 480 through the through-holes 580 of the cover 500 and the coupling holes 680 of the first O-ring 600. As a result, the first O-ring 600 is stably fixed between the housing body 400 and the cover 500 by means of the coupling holes 680 of the first O-ring 600, and therefore, the fixed state of the first O-ring 600 is stably maintained even when external vibration and impact are applied to the battery management system 100.

In opposite sides of the BMS PCB 200 are formed indentation parts 250 corresponding to the external shapes of the through-holes 580 and the coupling holes 680 such that the BMS PCB 200 can be easily mounted to the housing body 400.

As shown in FIG. 2, coupling holes 791 may be formed in a second O-ring 701, interposed between the connector 300 and the housing 400 and 500. In this case, additional screws 900 may be threadedly inserted into coupling holes (not shown) of the connector 300 through coupling holes 290 of the BMS PCB 200 and the coupling holes 791 of the second O-ring 701.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the above description, the battery management system according to the present invention is constructed in a structure in which moisture is prevented from permeation into the housing of the battery management system in a high-temperature, high-humidity environment. Consequently, the present invention has the effect of preventing the damage to and the corrosion of the BMS PCB, and therefore, improving the reliability of the battery pack and increasing the service life of the battery pack.

What is claimed is:

1. A battery management system for controlling an operation of a middle- or large-sized battery pack, the battery management system comprising:

a battery management system printed circuit board (BMS PCB) comprising a circuit and elements for controlling the operation of the battery pack, and indentation parts at peripheral edges of the BMS PCB;

a connector attached to one side of the BMS PCB;

a housing including a housing body for receiving the BMS PCB while partially exposing the connector, and a cover for covering the housing body, wherein the cover is coupled to the housing body while the cover is disposed on the housing body; and a waterproofing member including coupling holes, and interposed between the housing body and the cover, constituting the housing, such that the waterproofing member is in tight contact with the interface between the housing body and the cover, the waterproofing member being constructed in a structure to be coupled at coupling regions of the housing body and the cover.

2. The battery management system according to claim 1, wherein the waterproofing member is an O-ring.

3. The battery management system according to claim 1, wherein the housing body is provided inside sidewalls thereof with coupling grooves, each having a thread part formed therein, and the cover is provided with through-holes corresponding to the coupling grooves of the housing body, such that screws can be threadedly inserted into the coupling grooves through the through-holes.

4. The battery management system according to claim 1, wherein the coupling holes of the waterproofing member correspond to the through-holes of the cover, whereby the screws are threadedly inserted into the coupling grooves through the through-holes of the cover and the coupling holes of the waterproofing member, and therefore, the waterproofing member is fixed between the housing body and the cover.

5. The battery management system according to claim 1, wherein the waterproofing member is made of a material having high durability and elasticity.

6. The battery management system according to claim 1, further comprising:

another waterproofing member interposed at the interface between the connector and the housing.

* * * * *